United States Patent

Miyashita

(10) Patent No.: US 9,123,759 B2
(45) Date of Patent: Sep. 1, 2015

(54) SUSCEPTOR, VAPOR PHASE GROWTH APPARATUS, AND METHOD OF MANUFACTURING EPITAXIAL WAFER

(71) Applicant: SUMCO CORPORATION, Tokyo (JP)

(72) Inventor: Junji Miyashita, Saga (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 14/301,600

(22) Filed: Jun. 11, 2014

(65) Prior Publication Data

US 2014/0290564 A1    Oct. 2, 2014

Related U.S. Application Data

(62) Division of application No. 12/512,283, filed on Jul. 30, 2009.

(30) Foreign Application Priority Data

Jul. 31, 2008   (JP) ................. 2008-197880

(51) Int. Cl.

| H01L 21/673 | (2006.01) |
|---|---|
| C23C 16/458 | (2006.01) |
| C30B 25/12 | (2006.01) |
| C30B 29/06 | (2006.01) |
| H01L 21/02 | (2006.01) |

(52) U.S. Cl.

CPC ...... *H01L 21/67386* (2013.01); *C23C 16/4584* (2013.01); *C23C 16/4585* (2013.01); *C30B 25/12* (2013.01); *C30B 29/06* (2013.01); *H01L 21/0262* (2013.01); *H01L 21/02532* (2013.01)

(58) Field of Classification Search

CPC .... C30B 25/12; C30B 29/06; C23C 16/4584; C23C 16/4585; H01L 21/02532; H01L 21/0262
USPC .......................................................... 117/86
See application file for complete search history.

(56) References Cited

U.S. PATENT DOCUMENTS

| 5,785,764 A | 7/1998 | Hoshina et al. |
| 7,024,105 B2 * | 4/2006 | Fodor et al. .............. 392/418 |
| 2003/0075109 A1 | 4/2003 | Arai |

(Continued)

FOREIGN PATENT DOCUMENTS

| JP | 2003-12397 | 1/2003 |
| JP | 2004-63865 | 2/2004 |

(Continued)

OTHER PUBLICATIONS

Official Action issued on May 22, 2012 for Japanese family member Application No. JP2008-197880, together with an English translation.

*Primary Examiner* — Michael Kornakov
*Assistant Examiner* — Hua Qi
(74) *Attorney, Agent, or Firm* — Greenblum & Bernstein, P.L.C.

(57) ABSTRACT

An aspect of the present invention relates to a susceptor comprising a counterbored groove receiving a semiconductor wafer in the course of manufacturing an epitaxial wafer by vapor phase growing an epitaxial layer on a surface of the semiconductor wafer, wherein a lateral wall of the counterbored groove is comprised of at least one flat portion and at least one protruding portion being higher than the flat portion, and a height of the flat portion is equal to or greater than a thickness of the semiconductor wafer.

12 Claims, 3 Drawing Sheets

(56) References Cited

U.S. PATENT DOCUMENTS

| | | |
|---|---|---|
| 2004/0129225 A1 | 7/2004 | Kashino |
| 2007/0160507 A1 | 7/2007 | Satoh et al. |
| 2007/0227441 A1* | 10/2007 | Narahara et al. ............... 117/84 |
| 2008/0110401 A1 | 5/2008 | Fujikawa et al. |
| 2009/0127672 A1 | 5/2009 | Kinbara |
| 2009/0205562 A1 | 8/2009 | Wada |
| 2009/0235867 A1 | 9/2009 | Fujikawa et al. |

FOREIGN PATENT DOCUMENTS

| | | |
|---|---|---|
| JP | 2004-335861 | 11/2004 |
| JP | 2005-197380 | 7/2005 |
| JP | 3931578 B2 | 3/2007 |
| JP | 2007-189222 | 7/2007 |

* cited by examiner

Example 1

Comparative Example 1

SUSCEPTOR, VAPOR PHASE GROWTH APPARATUS, AND METHOD OF MANUFACTURING EPITAXIAL WAFER

CROSS-REFERENCE TO RELATED APPLICATIONS

This application is a Divisional of pending U.S. application Ser. No. 12/512,283, filed Jul. 30, 2009, which claims the benefit of priority under 35 USC 119 to Japanese Patent Application No. 2008-197880, filed on Jul. 31, 2008. The entire disclosures of U.S. application Ser. No. 12/512,283 and Japanese Patent Application No. 2008-197880 are expressly incorporated herein by reference in their entireties.

BACKGROUND OF THE INVENTION

1. Field of the Invention

The present invention relates to a susceptor and a vapor phase growth apparatus, and more particularly, to a susceptor permitting the manufacturing of an epitaxial wafer comprising an epitaxial layer of uniform thickness, and to a vapor phase growth apparatus comprising the susceptor.

The present invention further relates to a method of manufacturing an epitaxial wafer employing the above susceptor.

2. Discussion of the Background of the Invention

The reduction of crystal defects in semiconductors, particularly crystal defects on or near the surface, has been gaining importance in recent years with the high level of integration of semiconductor devices. Thus, the demand is increasing for epitaxial wafers obtained by vapor phase growth of epitaxial films of good crystallinity on the surfaces of substrate wafers.

An epitaxial wafer is normally manufactured by feeding a starting material gas onto the surface of a substrate wafer while the substrate wafer is being supported by a susceptor to induce vapor phase growth of an epitaxial layer. A susceptor having a counterbored groove receiving the wafer is generally employed. Such susceptor is disclosed in, for example, Japanese Unexamined Patent Publication (KOKAI) No. 2003-12397, which is expressly incorporated herein by reference in its entirety.

The use rate in the surface when manufacturing semiconductor devices from epitaxial wafers has tended to increase with the level of integration in recent years. However, when a conventional susceptor such as the susceptor described in Japanese Unexamined Patent Publication (KOKAI) No. 2003-12397 is employed to vapor phase grow an epitaxial film on a substrate wafer, depending on the orientation of the crystal axis, a phenomenon has tended to occur whereby the thickness along the perimeter portion of the epitaxial film has differed from the thickness at the center portion thereof. The perimeter portions of such epitaxial wafers cannot be used to fabricate devices, making it difficult to raise the use rate in the surface.

SUMMARY OF THE INVENTION

Accordingly, a non-limiting aspect of the present invention provides for means for manufacturing an epitaxial wafer having an epitaxial layer of uniform thickness.

A first non-limiting aspect of the present invention relates to a susceptor comprising:

a counterbored groove receiving a semiconductor wafer in the course of manufacturing an epitaxial wafer by vapor phase growing an epitaxial layer on a surface of the semiconductor wafer, wherein a lateral wall of the counterbored groove is comprised of at least one flat portion and at least one protruding portion being higher than the flat portion, and a height of the flat portion is equal to or greater than a thickness of the semiconductor wafer.

The height of the flat portion may be about 1.0 to 2.0 times greater than the thickness of the semiconductor wafer.

The difference in height between the highest portion of the protruding portion and an upper surface of the flat portion may range from about 0.1 to 5 mm.

A second non-limiting aspect of the present invention relates to a vapor phase growth apparatus comprising:

the above susceptor; and a reaction chamber housing the susceptor.

A third non-limiting aspect of the present invention relates to a method of manufacturing an epitaxial wafer by vapor phase growing an epitaxial layer on a surface of a semiconductor wafer, comprising:

conducting the vapor phase growing in a state where the semiconductor wafer is received in the counterbored groove of the above susceptor.

The semiconductor wafer may be received in the counterbored groove such that, on the surface of the semiconductor wafer, an edge surface in a direction where close {111} planes are present is positioned opposite the protruding portion.

According to a non-limiting feature of the present invention, an epitaxial wafer having an epitaxial layer of uniform film thickness over the entire surface can be provided.

Since a non-limiting feature of the present invention permits the formation of an epitaxial layer of good crystallinity on a semiconductor wafer, it is possible to reduce the crystal defects in a semiconductor element based on the crystal orientation of a semiconductor wafer, particularly crystal defects on or near the surface.

Other exemplary embodiments and advantages of the present invention may be ascertained by reviewing the present disclosure and the accompanying drawings.

BRIEF DESCRIPTION OF THE DRAWINGS

The present invention will be described in the following text by the exemplary, non-limiting embodiments shown in the figures, wherein.

Figure 1A:
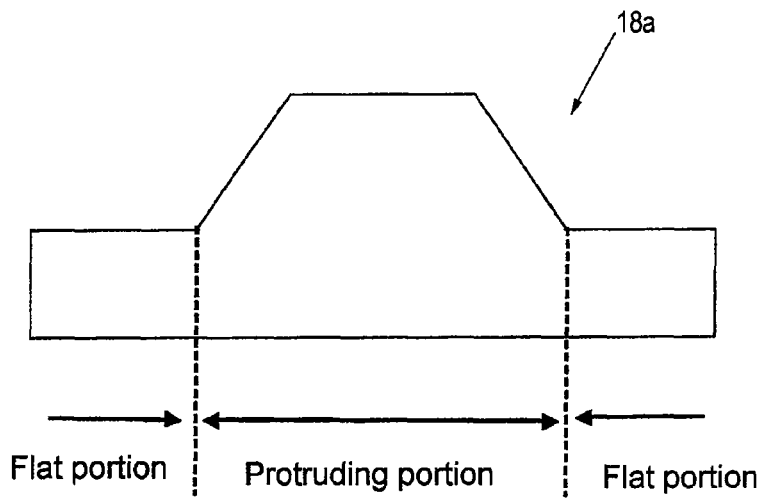
FIGS. 1(a)-(c) are partially enlarged views of the susceptor of a non-limiting aspect of the present invention.

Explanations of Symbols In the Drawings are As Follows:

1 Vapor phase growth apparatus
2 Reaction chamber
3 Upper dome
4 Lower dome
5 Dome mounting member
6 Halogen lamp
7 Susceptor rotating shaft
8 Support arm
9 Lift pin
10 Susceptor
11 Lift arm
12 Gas feed inlet
13 Gas exhaust outlet 14 Gas feed inlet
15 Gas exhaust outlet

DETAILED DESCRIPTION OF THE
EMBODIMENTS

Unless otherwise stated, a reference to a compound or component includes the compound or component by itself, as well as in combination with other compounds or components, such as mixtures of compounds.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

The following preferred specific embodiments are, therefore, to be construed as merely illustrative, and non-limiting to the remainder of the disclosure in any way whatsoever. In this regard, no attempt is made to show structural details of the present invention in more detail than is necessary for fundamental understanding of the present invention; the description taken with the drawings making apparent to those skilled in the art how several forms of the present invention may be embodied in practice.

The first non-limiting aspect of the present invention relates to a susceptor comprising a counterbored groove receiving a semiconductor wafer in the course of manufacturing an epitaxial wafer by vapor phase growing an epitaxial layer on a surface of the semiconductor wafer. In the susceptor, a lateral wall of the counterbored groove is comprised of at least one flat portion and at least one protruding portion being higher than the flat portion, and a height of the flat portion is equal to or greater than a thickness of the semiconductor wafer.

For example, a phenomenon whereby the perimeter film thickness increases locally in the <110> orientation is observed when vapor phase growing an epitaxial layer on the (100) plane of a semiconductor wafer. In this context, the "perimeter" refers to the area from the outer rim of the wafer to 5 mm from the outer rim, for example. However, depending on the diameter of the semiconductor wafer, there may also be cases where it comprises the area to 1 mm from the outer rim, or to 7 mm from the rim, for example. The above phenomenon is thought to occur because the rate of vapor phase growth in the <100> orientation at the perimeter is greater than that in the <111> orientation at the perimeter. That is, the phenomenon whereby the thickness at the perimeter of the epitaxial layer differs greatly from the thickness in the center portion is thought to occur because there are orientations with rapid vapor phase growth rates and orientations with slow vapor phase growth rates in the wafer surface at the perimeter. That is, since the silicon growth rate on the {111} planes is slow, the growth rate on main surfaces adjacent thereto becomes relatively fast, and the epitaxial layer becomes locally thicker. In the susceptor of a non-limiting aspect of the present invention, since portions (the protruding portions) of the lateral wall of the counterbored groove are high, as set forth above, by receiving the semiconductor wafer in the counterbored groove so that the protruding portions face the edge surface in the orientations of rapid vapor phase growth rate, the amount of starting material gas that is fed to the perimeter can be reduced in the orientations of rapid vapor phase growth rate to inhibit vapor phase growth along the perimeter. Thus, the differences in vapor phase growth rate due to crystal orientation along the perimeter of the semiconductor wafer can be inhibited, and thus an epitaxial layer of uniform film thickness can be formed over the entire surface.

Further, by providing a counterbored groove the lateral wall of which is of a height that is greater than the thickness of the wafer, and positioning the wafer therein, wraparound of silicon onto the rim portion (particularly the rear surface), including the chamfer of the wafer, can be suppressed. Providing protruding portions on the lateral wall can prevent local silicon growth in the rim portion in orientations with rapid vapor phase growth rates, stabilize the vapor phase growth rate at the perimeter, and prevent variation, thereby making it possible to stably obtain an epitaxial layer of uniform thickness.

Further, it becomes difficult to achieve uniform film thickness over the entire surface in orientations other than the orientation in which it is desirable to inhibit the vapor phase growth rate at the perimeter when the height of the lateral wall of the counterbored groove is changed, as set forth above. Thus, the lateral wall is made flat everywhere except for the protruding portions in the susceptor.

The susceptor of a non-limiting aspect of the present invention will be described in further detail below.

Figure 1B:
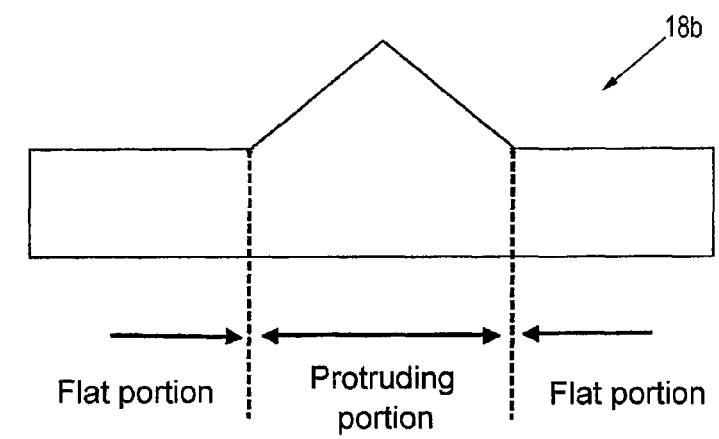
Figure 1C:
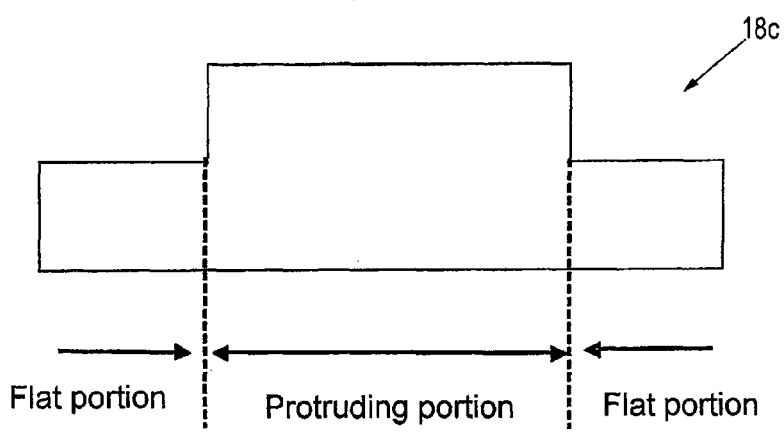

FIG. 1 shows a partially enlarged view (a view of the lateral wall from within the susceptor groove) of the susceptor of a non-limiting aspect of the present invention. The protruding portions need only be higher than the flat portions; the shape thereof is not specifically limited. Specific examples of the sectional shape of the protrusions are trapezoidal (FIG. 1(a)), triangular (FIG. 1(b)), and rectangular (FIG. 1(c)).

The shape of the protruding portions will be further described with reference to FIG. 2.

Figure 2:
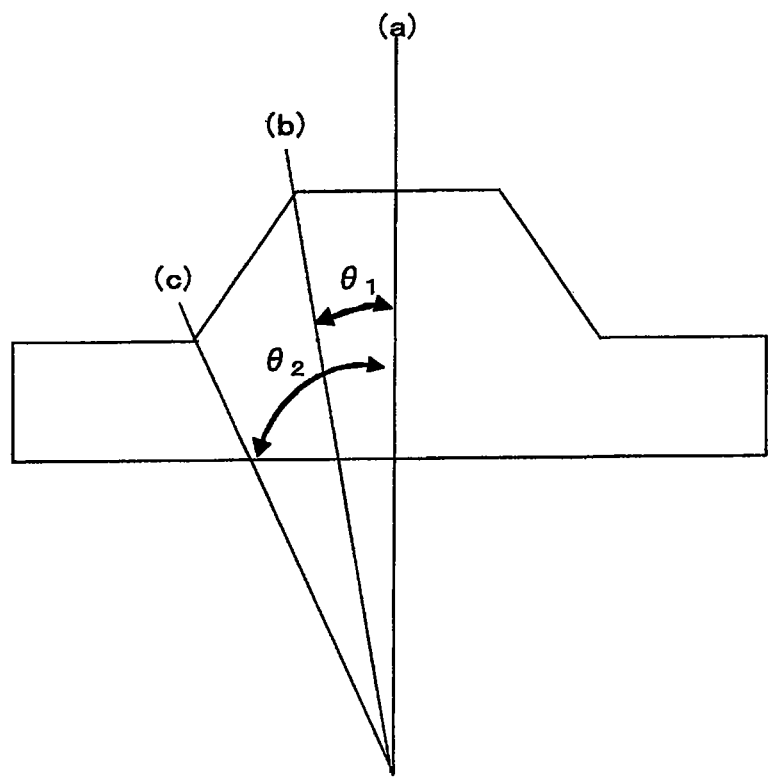
FIG. 2 is a descriptive drawing of the shape of the protruding portion in the susceptor of a non-limiting aspect of the present invention.

In FIG. 2, straight line (a) denotes an imaginary straight line that begins at the center of the wafer surface, runs in an orientation (for example, in <110> orientations parallel to {100} planes, or in an orientation equivalent to [011] orientation parallel to (100) plane) with a greater rate of perimeter vapor phase growth than the other orientations, and passes through the center of the upper surface (flat surface) of the protruding portion. Straight line (b) denotes an imaginary straight line that begins at the center of the wafer surface and runs through the edge of the upper surface of the protruding portion. Straight line (c) denotes an imaginary straight line that begins at the center of the wafer surface and runs through the lower edge of the protruding portion. The angle $\theta_1$ formed by straight line (a) and straight line (b) can be about 0 to 15°, for example, and is desirably about 0 to 10°. When $\theta_1$ is 0°, the sectional shape of the protruding portion becomes triangular. The angle $\theta_2$ formed by straight line (a) and straight line (c) is desirably about 5 to 20°, for example.

The number of such protruding portions in the susceptor is desirably equal to the number of orientations of rapid perimeter vapor phase growth rate. For example, when the surface on which the epitaxial layer is formed is (100) plane, the orientations in which perimeter vapor phase growth should be suppressed is <110> orientations. Thus, the number of protruding portions equal to the number of orientations (4) is desirably provided. When the wafer notch of the lateral wall of the counterbored groove is made in <110> orientations and the opposing position (notch-opposing part) is made 0°, it is preferable to provide protruding portions in the 85° to 95°, 175° to 185°, 265° to 275°, and 355° to 5° portions.

The "flat portion" in the susceptor of a non-limiting aspect of the present invention refers to a portion of which upper surface is flat, as shown in FIG. 1. The height thereof is made equal to or greater than the thickness of the semiconductor wafer positioned within the counterbored groove to prevent wraparound of starting material gas onto the rear surface of the wafer, as set forth above. From the perspective of achieving good vapor phase growth on the surface of the wafer while preventing wraparound of starting material gas onto the rear surface of the wafer, the height of the flat portions is desirably about 1.0 to 2.0-fold, preferably 1.0 to 1.3-fold, the height of the positioned wafer. Specifically, it can be about 0.6 to 1.0 mm.

The difference in height between the highest portion of the protruding portion and the upper surface of the flat portion is desirably about 0.1 to 5 mm, preferably about 0.1 to 0.5 mm. Within the above range, vapor phase growth of the perimeter can be inhibited without significantly inhibiting vapor phase growth in the area other than the perimeter in orientations of rapid vapor phase growth, achieving the uniformity of the film thickness in the surface.

The counterbored groove is comprised of, for example, a lateral wall of the shape set forth above and an approximately round bottom. When the distance from the outermost edge of the semiconductor wafer positioned in the counterbored groove to the lateral wall is excessive, it may become difficult to achieve an effect by providing protruding portions. From that perspective, the shape of the bottom of the counterbored groove is desirably determined based on the size of the positioned semiconductor wafer so that the distance from the outermost edge of the semiconductor wafer to the lateral wall will be about 0.5 to 2.0 mm.

The susceptor of a non-limiting aspect of the present invention can be manufactured using the materials used in conventional susceptors. For example, the susceptor can be manufactured by coating SiC on the surface of a carbon base material. Wafer contamination by the base material can be prevented by coating SiC on the surface of the base material.

The vapor phase growth apparatus of the second non-limiting aspect of the present invention comprises the above susceptor and a reaction chamber housing the susceptor. A configuration that is identical to that of known vapor phase growth apparatuses normally employed in the manufacturing of epitaxial wafers, with the exception of containing the susceptor of a non-limiting aspect of the present invention, may be employed. Configurations of vapor phase growth apparatuses are described in detail in Japanese Unexamined Patent Publication (KOKAI) Nos. 2004-63865, 2005-197380, and 2007-189222 or English language family member US 2007/0160507 A1, and Japanese Patent No. 3,931,578 or English language family member US 2003/0075109 A1, for example. The contents of the above applications are expressly incorporated herein by reference in their entirety.

The third non-limiting aspect of the present invention relates to a method of manufacturing an epitaxial wafer by vapor phase growing an epitaxial layer on a surface of a semiconductor wafer. In the above method, the vapor phase growing is conducted in a state where the semiconductor wafer is received in the counterbored groove of the susceptor of a non-limiting aspect of the present invention.

Figure 3:
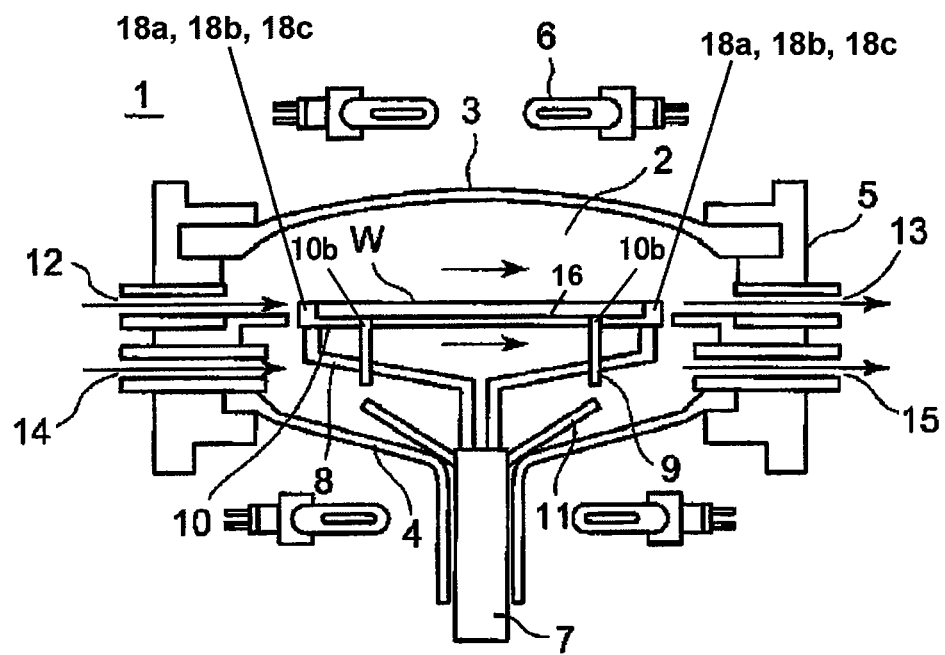
FIG. 3 is a schematic sectional view of an example of the vapor phase growth apparatus of a non-limiting aspect of the present invention.

FIG. 3 shows an example (schematic sectional view) of the vapor phase growth apparatus of a non-limiting aspect of the present invention. The vapor phase growth apparatus of a non-limiting aspect of the present invention and the method of manufacturing an epitaxial wafer of a non-limiting aspect of the present invention will be described below based on FIG. 3. However, the present invention is not limited to the form shown in FIG. 3.

In FIG. 3, a vapor phase growth apparatus ("apparatus" hereinafter) 1 comprises in the interior thereof a chamber ("reaction chamber" hereinafter) 2 forming an epitaxial film. Reaction chamber 2 is equipped with an upper dome 3, a lower dome 4, and a dome mounting member 5. Upper dome 3 and lower dome 4 are comprised of a transparent material such as quartz. Multiple halogen lamps 6 are disposed above and below apparatus 1, heat susceptor 10 and semiconductor wafer W. Susceptor 10 is rotated by support arms 8, connected to a susceptor rotating shaft 7, that insert into the perimeter of the lower surface thereof. Susceptor 10 has a counterbored groove in which is positioned a wafer, as described above. The counterbored groove is comprised of an approximately round bottom 16 receiving semiconductor wafer W, and a lateral wall 18a, 18b, 18c surrounding the bottom. As shown in FIG. 3, a total of three throughholes (for inserting lift pins) 10b can be formed at intervals of about 120° each, for example, in a circumferential direction in the perimeter of susceptor 10. A lift pin 9, lifting and lowering semiconductor wafer W, is freely inserted in each lift pin insertion hole 10b. Lift pins 9 are lifted and lowered by lift arms 11.

In dome mounting member 5, at a height position opposite susceptor 10, a gas supply inlet 12 and a gas exhaust outlet 13 are arranged in opposing fashion. Through gas supply inlet 12, a reaction gas, in the form of a Si source gas (starting material gas) such as SiHCl3 that has been diluted with hydrogen gas (carrier gas) and into which has been mixed a trace quantity of dopant, is fed into the interior of the reaction chamber 2 in a direction (horizontal) parallel to the surface of semiconductor wafer W. The reaction gas that is fed in passes over the surface of semiconductor wafer W, and following epitaxial film growth, is exhausted to the exterior of apparatus 1 through gas exhaust outlet 13. Carrier gas is normally fed through a gas supply inlet 14 on the lower surface of the susceptor to keep the circumference of the wafer clean. Using the susceptor of a non-limiting aspect of the present invention can make it possible to reduce the amount of starting material gas fed to the perimeter in orientations where the rate of vapor phase growth of the perimeter is rapid. Differences in the rate of perimeter vapor phase growth depending on the orientation of the crystals can be thus reduced, making it possible to obtain an epitaxial wafer of uniform film thickness over the entire surface.

One example of the semiconductor wafer is a silicon wafer. However, other semiconductor wafers such as compound semiconductor wafers are also acceptable; there is no specific limitation. The surface on which the epitaxial layer is formed is not specifically limited. Examples are the {100} planes and the {110} planes. In the formation of an epitaxial layer with a conventional susceptor, the epitaxial layer becomes thick along the outer rim in axial directions parallel to the main surface in directions in which the {111} planes are present, on the main surface adjacent to the {111} planes. For example, since the rate of vapor phase growth at the perimeter in the <100> orientations is greater than the rate of vapor phase growth at the perimeter in the <111> orientations, when an epitaxial layer is grown on the (100) plane, the perimeter film thickness locally increases on the (100) plane in the <110> orientations, as set forth above. By contrast, according to the susceptor of a non-limiting aspect of the present invention, an epitaxial layer of uniform film thickness can be obtained over the entire surface by positioning a semiconductor wafer in the counterbored groove such that the edge surface in an orientation where the rate of vapor phase growth is rapid at the perimeter, specifically, in an orientation where close {111} planes are present, is positioned opposite the protruding portion.

The thickness of the semiconductor wafer is, for example about 600 to 1,000 micrometers. As set forth above, the height of the lateral wall of the counterbored groove of the susceptor is determined based on the thickness of the semiconductor wafer.

The semiconductor wafer can be positioned, for example, by first conveying the semiconductor wafer into the reaction chamber from an external conveyor device, lifting the semiconductor wafer upward through the throughholes by means of the lift pins, receiving the semiconductor wafer, and then lowering the semiconductor wafer down onto the susceptor. Subsequently, starting material gas can be fed to the upper surface side of the susceptor in the reaction chamber to bring the surface of the semiconductor wafer into contact with the starting material gas and conduct a vapor phase reaction (epitaxial growth). Examples of starting material gases that can be employed are: $SiH_4$, $SiH_2Cl_2$, $SiHCl_3$, and $SiCl_4$. The starting material gas is normally fed in after being mixed with a carrier gas. Examples of carrier gases that can be employed are hydrogen gas and inert gases. It suffices to suitably set the blending ratio of the starting material gas and the carrier gas.

It suffices to determine the flow rate of the gas supplied to the upper surface side of the susceptor based on the temperature conditions within the reaction chamber, the desired epitaxial layer thickness, and the like. It is normally about 50 to 100 liters/minute.

When feeding carrier gas to the lower surface side of the susceptor, a carrier gas such as hydrogen or an inert gas can be employed. The flow rate of the carrier gas fed to the lower surface side of the susceptor is desirably set to about ⅓ to ¼ the flow rate of the gas fed to the upper surface side.

When feeding the gas, the semiconductor wafer is normally heated. As shown in FIG. 3, a heating means in the form of heating lamps provided above and/or below the susceptor can be employed. An annular preheating plate (preheating ring) can also be provided around the susceptor. The heating temperature of the wafer and susceptor can be suitably set.

Once the vapor phase growth process has been completed and an epitaxial layer has been formed on the surface, the wafer can be lifted upward through the throughholes by the lift pins and picked up. The wafer that has been picked up can be moved to a conveyor device by a robot arm or the like and discharged to the exterior of the reaction chamber. Epitaxial wafers can be produced in large numbers by repeating the above series of steps.

EXAMPLES

The present invention will be described in detail below based on examples. However, the present invention is not limited to the examples.

Example 1

A 300 mm semiconductor wafer on which an epitaxial layer is to be formed on the (100) face thereof was placed on a susceptor that had been disposed within the reaction chamber of a vapor phase growth apparatus and that was equipped with protruding portions in the 85° to 95°, 175° to 185°, 265° to 275°, and 355° to 5° portions thereof when the position opposite the wafer notch (notch-opposing part) of the lateral wall of the counterbored groove was aligned with 0°.

An epitaxial film was grown by vapor phase epitaxy on the surface of the semiconductor wafer placed on the susceptor. The epitaxial growth process will be described in detail below.

The vapor phase epitaxial growth apparatus employed comprised a chamber above and below which heaters were disposed, and in the center of which was horizontally disposed a susceptor that was capable of holding a single wafer and that was round when viewed from above.

An upper counterbored portion (annular difference in height), receiving a semiconductor wafer in a lateral state in which the top and bottom surfaces were horizontal, was formed in a portion on the inner circumference side of the surface of the susceptor. On one lateral part of the chamber, gas feed inlets were formed through which a prescribed carrier gas ($H_2$ gas) and a prescribed source gas ($SiHCl_3$ gas) flowed parallel to the wafer surface in the upper space of the chamber. Exhaust outlets for the two gases were provided on the other lateral part of the chamber.

During epitaxial growth, the semiconductor wafer was first placed on the susceptor. The details of how it was positioned were as set forth above.

Next, an epitaxial film was then grown on the surface of the heated semiconductor wafer. That is, the carrier gas and the source gas passed through their corresponding gas feed inlets and were introduced into the chamber. The pressure within the furnace was adjusted to 100±20 KPa. Silicon produced by the thermal decomposition or reduction of source gas was precipitated at a reaction rate of 1.5 to 4.5 micrometers/minute on the semiconductor wafer that had been heated to 1,000 to 1,200° C. An epitaxial film comprised of single crystal silicon 2 to 20 micrometers in thickness was thus grown on the surface of the semiconductor layer.

An epitaxial wafer was manufactured by the above process.

Comparative Example 1

With the exception that a conventional susceptor (a susceptor that had a counterbored groove of constant lateral wall height and had no protruding portions) was employed, an epitaxial wafer was manufactured by the same method as in Example 1.

Film Thickness Distribution Along the Perimeter of the Epitaxial Wafer

Figure 4:
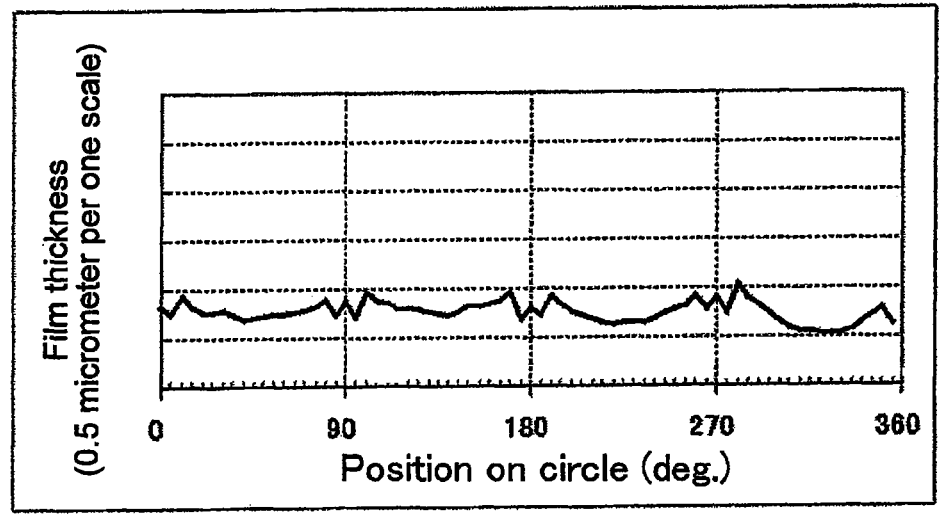
FIG. 4 shows the distribution of the film thickness along the perimeter of the epitaxial wafers manufactured in Example 1 and Comparative Example 1.
Figure 4:
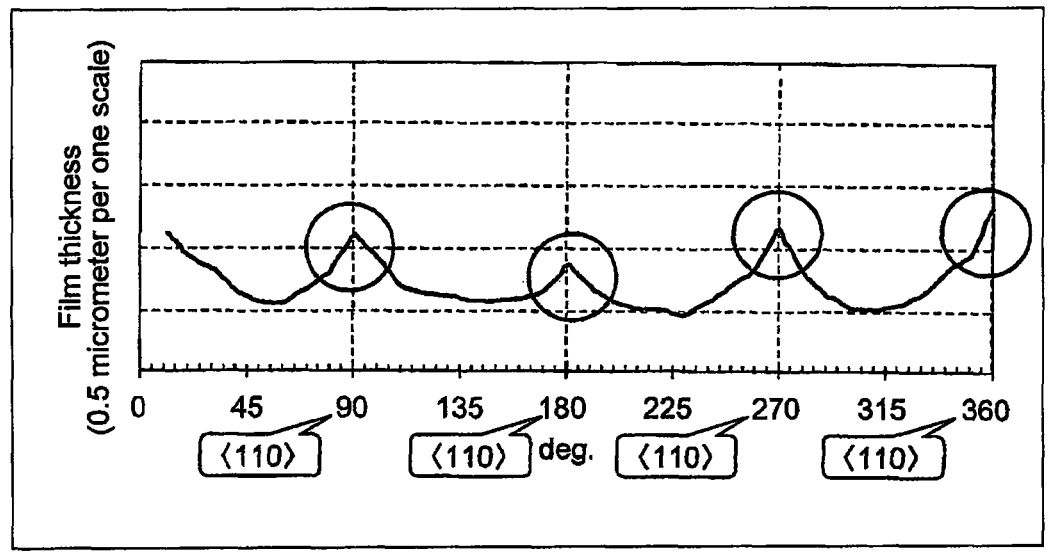

The thickness of the epitaxial films formed on the surfaces of the semiconductor wafers in Example 1 and Comparative Example 1 was measured by infrared interferometry; the results are given in FIG. 4. The results shown in FIG. 4 are measurements of the film thickness along a circle at a point 2 mm from the perimeter edge of the semiconductor wafer. As shown in the lower drawing of FIG. 4, in the epitaxial wafer manufactured in Comparative Example 1, a phenomenon was observed whereby the film along the perimeter was locally thicker in the <110> orientations.

Measurement of the Variation in Film Thickness

A comparison of the film thickness of the epitaxial wafer manufactured in Example 1 to that of the epitaxial wafer manufactured in Comparative Example 1 as measured in the <100> orientations and the <110> orientations by an epitaxial film thickness measuring device (FT-IR) revealed that the film thickness in the <110> orientations was 1.85 percent greater than the film thickness in the <100> orientations, in the epitaxial layer manufactured in Comparative Example 1. By contrast, there was an increase of 0.75 percent in the epitaxial layer manufactured in Example 1, indicating suppression to about half the level in Comparative Example 1.

From these results, it will be understood that it was possible to form an epitaxial layer of uniform film thickness over the entire surface according to the present invention.

Although the present invention has been described in considerable detail with regard to certain versions thereof, other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any embodiments thereof.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

What is claimed is:

1. A method of manufacturing an epitaxial wafer by vapor phase growing an epitaxial layer on a (100) plane of a semiconductor wafer, wherein
the vapor phase growing is conducted in a state where the semiconductor wafer is received in the counterbored groove of a susceptor, the susceptor comprising the counterbored groove receiving a semiconductor wafer,
a lateral wall of the counterbored groove is comprised of flat portions and protruding portions being higher than the flat portions, and a height of the flat portion is equal to or greater than a thickness of the semiconductor wafer, and
the semiconductor wafer is received in the counterbored groove such that, on the plane of the semiconductor wafer, an edge plane in a direction where immediately adjacent {111} planes are present is positioned opposite the protruding portion.

2. The method according to claim 1, wherein a difference in height between a highest portion of the protruding portions and an upper surface of the flat portions ranges from about 0.1 to 5 mm.

3. The method according to claim 1, wherein the protruding portions are equally spaced about a circumference of a bottom portion of the counterbored groove.

4. The method according to claim 1, wherein the protruding portions comprise four protruding portions.

5. The method according to claim 1, wherein the flat portions and the protruding portions are unitarily arranged about a circumference of a bottom portion of the counterbored groove.

6. The method according to claim 1, wherein an uppermost surface of the lateral wall comprises the flat portions and the protruding portions.

7. The method according to claim 6, wherein the uppermost surface of the lateral wall is uneven in a height direction.

8. The method according to claim 1, wherein the height of the flat portions is about 0.6 to 1.0 mm.

9. The method according to claim 1, wherein the protruding portions are trapezoidal in shape.

10. The method according to claim 1, wherein the protruding portions are triangular in shape.

11. The method according to claim 1, wherein the number of the protruding portions is equal to the number of orientations of rapid perimeter vapor phase growth that grows at a rate faster than that of other orientations of perimeter vapor phase growth.

12. A method of manufacturing an epitaxial wafer by vapor phase growing an epitaxial layer on a (100) plane of a semiconductor wafer, the method comprising:
receiving the semiconductor wafer in a counterbored groove of a susceptor, and
providing a lateral wall of the counterbored groove including fiat portions and protruding portions being higher than the fiat portions, wherein a height if the fiat portion is equal to or greater than a thickness of the semiconductor wafer,
wherein said receiving the semiconductor wafer in the counterbored groove comprises positioning, on the plane of the semiconductor wafer, an edge plane extending in a direction where immediately adjacent {111} planes are present opposite the protruding portion.

* * * * *